United States Patent [19]
Gould

[11] Patent Number: 4,480,240
[45] Date of Patent: Oct. 30, 1984

[54] APPARATUS FOR SEPARATING RF GROUND PLANE FROM HOUSING

[76] Inventor: Harry J. Gould, 1649 E. Hale, Mesa, Ariz. 85204

[21] Appl. No.: 432,089

[22] Filed: Sep. 30, 1982

[51] Int. Cl.³ .................. H05K 5/02; H01P 1/00
[52] U.S. Cl. ............................ 333/246; 361/399
[58] Field of Search ............ 333/246, 247, 238, 251; 361/399, 397

[56] References Cited

U.S. PATENT DOCUMENTS

| | | | |
|---|---|---|---|
| 2,812,501 | 11/1957 | Sommers | 333/238 |
| 4,129,897 | 12/1978 | Telewski et al. | 333/238 X |
| 4,276,655 | 6/1981 | Kraemer et al. | 333/246 X |

Primary Examiner—Paul L. Gensler
Assistant Examiner—Benny Lee
Attorney, Agent, or Firm—H. Gordon Shields

[57] ABSTRACT

Apparatus for separating a radio frequency (rf) ground plane from a metal housing in which a circuit board is disposed includes an rf choke and a dielectric layer for separating the housing from the circuit board.

11 Claims, 9 Drawing Figures

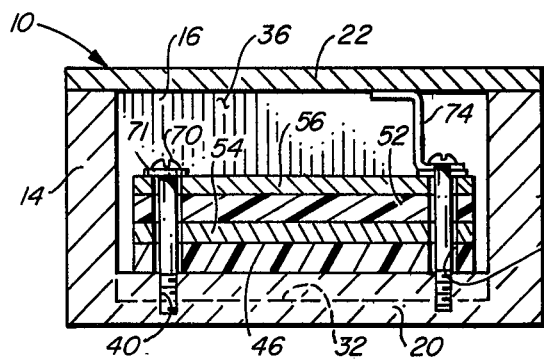
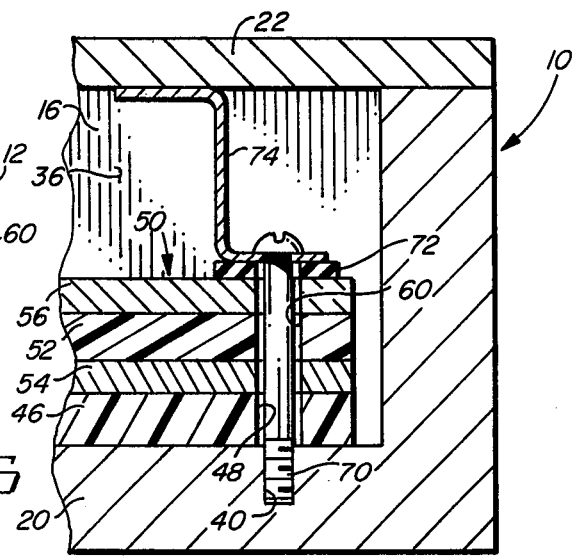
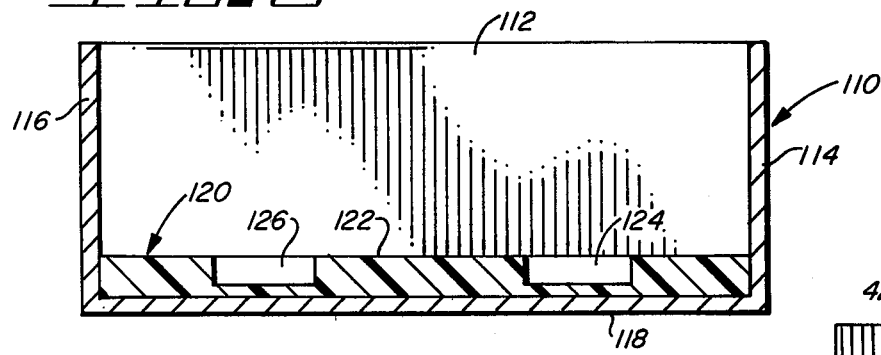
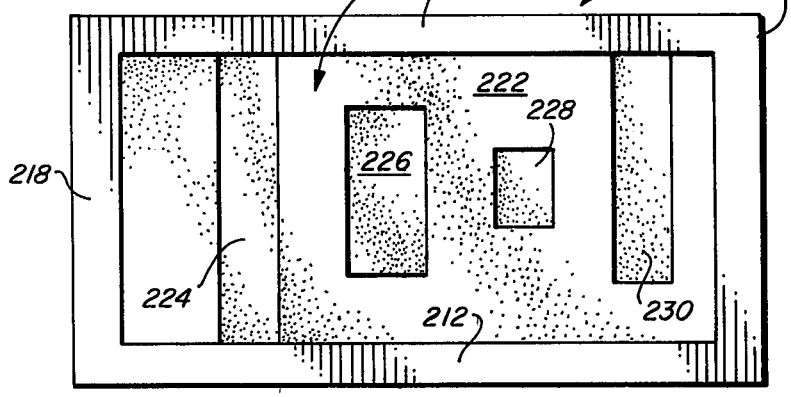
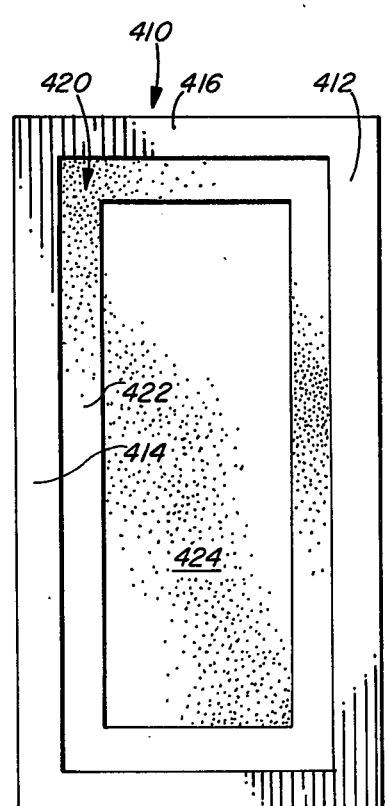
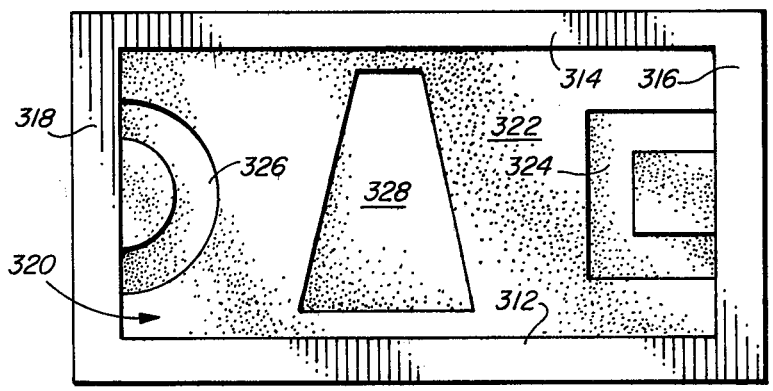

APPARATUS FOR SEPARATING RF GROUND PLANE FROM HOUSING

BACKGROUND OF THE INVENTION

1. Field of the Invention

This invention relates to housing apparatus for electronic elements such as amplifiers and, more particularly, to the housing for electronic apparatus which includes a metal housing in which the electronic elements are disposed.

2. Description of the Prior Art

Housings for electronic elements, such as low noise amplifiers, are typically made of metal. Within a housing is a chamber in which the electronic apparatus is disposed. The elements or components, such as amplifier elements, are commonly disposed on a circuit board located within the housing. One end of the housing is designated as the input end, and the other end of the housing is designated as the output end. For amplifiers, the object of the amplifier is to provide high gain with low noise. The input signal at the input end of a housing is generally rather low, and the elements of the amplifier are designed to provide as much gain as is practical with a minimum of noise in the output signal. One of the problems inherent in the prior art is the propagation of rf fields inside the housing which tends to interfere with the gain performance of the amplifier. The elimination of such rf interference is a problem in the prior art. The apparatus of the present invention allows substantial gain without the attendant interference problems.

SUMMARY OF THE INVENTION

The invention described and claimed herein includes a metallic housing for electronic elements or components having a chamber in which a circuit board is disposed and high impedance and low impedance regions in the bottom of the housing for preventing the propagation of rf fields and resonant frequencies.

Among the objects of the present invention are the following:

To provide new and useful housing apparatus for electronic components;

To provide new and useful housing apparatus for a high gain amplifier;

To provide new and useful housing apparatus for electronic elements in which resonant frequencies are suppressed;

To provide new and useful housing apparatus for preventing rf interference in an amplifier;

To provide new and useful housing apparatus for an amplifier having regions of high impedance and low impedance to prevent the propagation of rf fields; and To provide new and useful housing apparatus which will allow GaAsFET amplifiers to operate from a single voltage supply.

BRIEF DESCRIPTION OF THE DRAWING

FIG. 4 is a view in partial section of a portion of the apparatus of the present invention, taken generally along line 4—4 of FIG. 2.

FIG. 5 is an enlarged view in partial section of a portion of the apparatus of FIG. 4.

FIG. 6 is a view in partial section, somewhat enlarged, of an alternate embodiment of the apparatus of the present invention.

FIG. 7 is a top view of an alternate embodiment of the apparatus of the present invention.

FIG. 8 is a top view of another alternate embodiment of the apparatus of the present invention.

FIG. 9 is a top view of another alternate embodiment of the apparatus of the present invention.

DESCRIPTION OF THE PREFERRED EMBODIMENT

Figure 1:
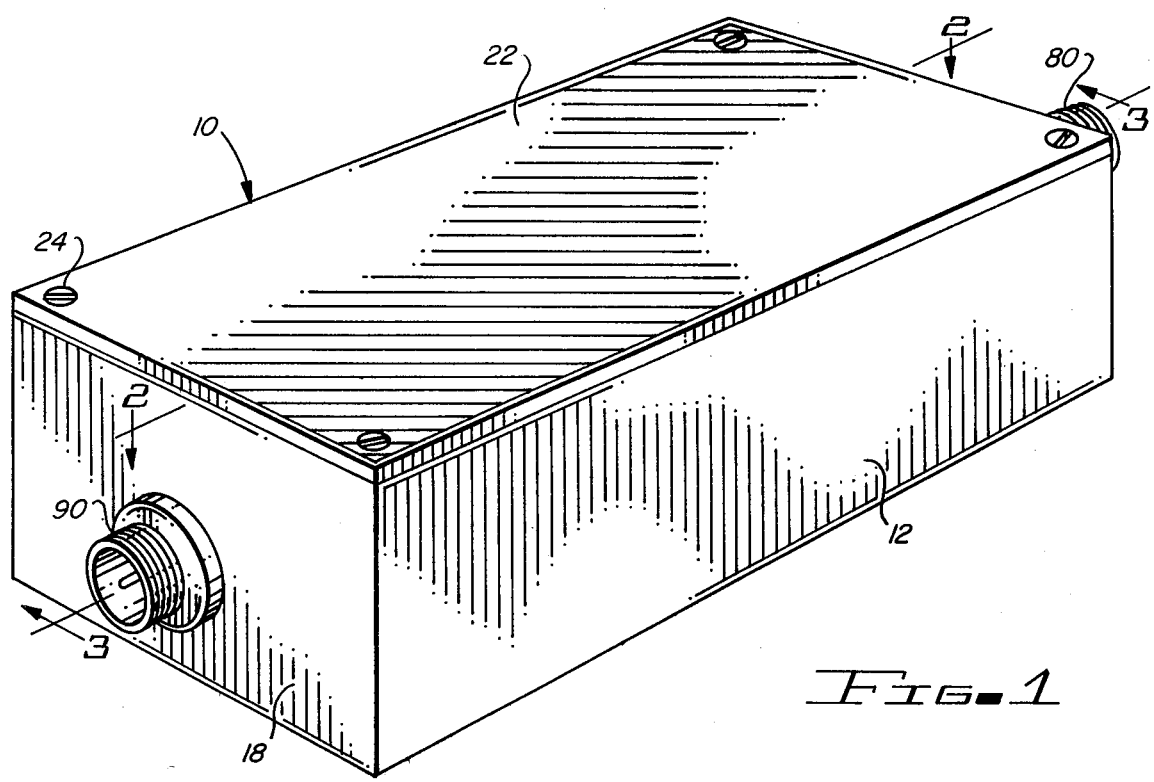
FIG. 1 is a perspective view of the apparatus of the present invention.

FIG. 1 is a perspective view of housing apparatus 10 for electric components or elements, such as a low noise amplifier, embodying the present invention. The housing 10 is generally rectangular in configuration, and it comprises a generally rectangular box in which circuitry elements are disposed. The housing includes four sides, a bottom, and a top. Two sides, including an elongated side 12 and an end wall or side 18, and a top 22 are shown in FIG. 1. The top 22 is secured to the lower portion of the housing 10, which is generally unitary, by a plurality of appropriate fasteners 24. In FIG. 1, four fasteners 24, which may be screws, are shown.

Figure 2:
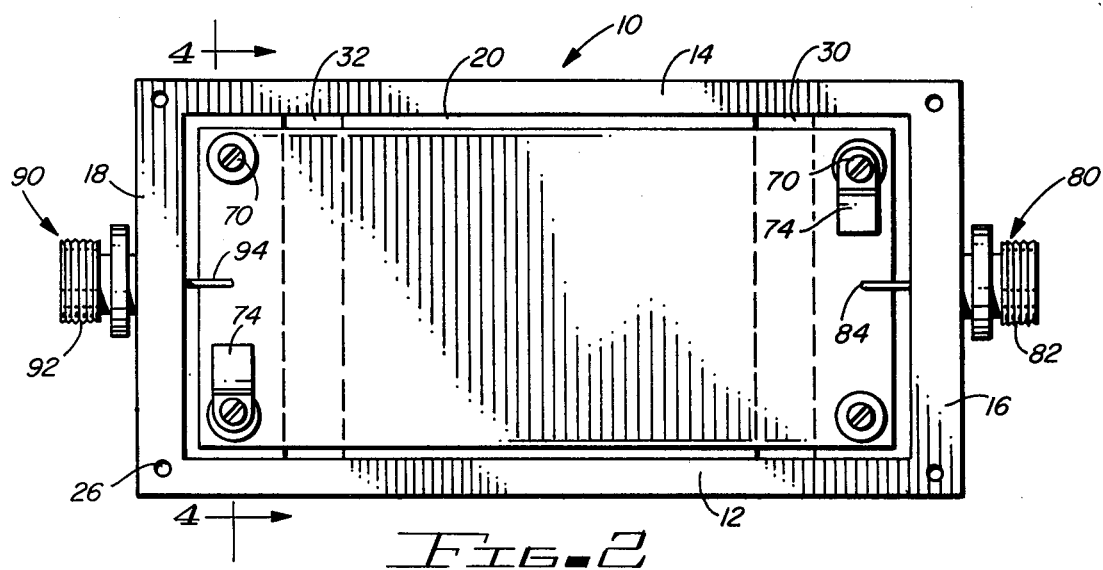
FIG. 2 is a top view of a portion of the apparatus of FIG. 1, taken generally along line 2—2 of FIG. 1.
Figure 3:
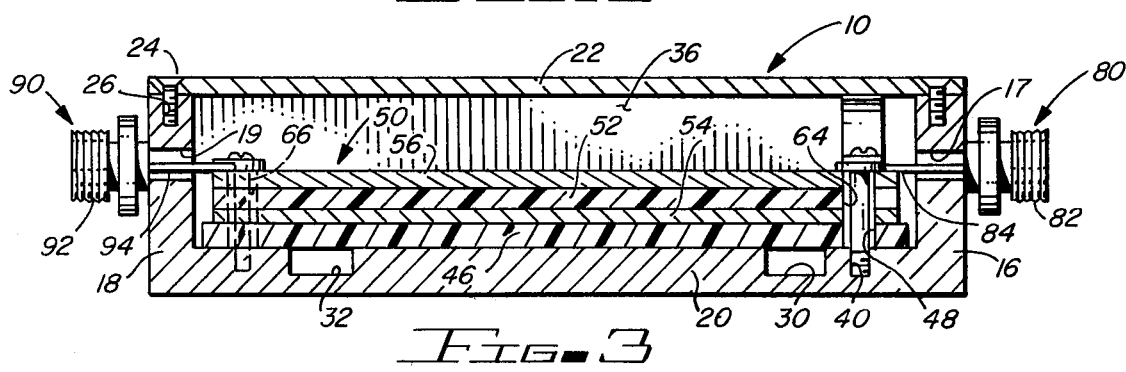
FIG. 3 is a view in partial section taken generally along line 3—3 of FIG. 1.

FIG. 2 is a top view of the housing apparatus 10 with the cover 22 removed. FIG. 2 is taken generally along line 2—2 of FIG. 1. FIG. 3 is a view in partial section of the housing apparatus 10 taken generally along line 3—3 of FIG. 1, but with a deviation therein to illustrate features of the invention, all as will be discussed below. FIG. 4 is another view in partial section of the housing apparatus 10 taken generally along line 4—4 of FIG. 2. FIG. 5 is an enlarged view in partial section of a portion of FIG. 4, generally illustrating in substantial detail features of the housing apparatus 10. For the following discussion, reference will generally be made to FIGS. 1, 2, 3, 4, and 5.

The housing apparatus 10 includes four sides, all of which are generally rectangular in configuration, and which include two elongated sides and two ends. The elongated side elements include sides 12 and 14 which are secured to ends 16 and 18. The four sides 12 ... 18 extend upwardly generally perpendicularly from, and are secured to, a bottom 20. The generally rectangular box, which defines the housing, is closed by a top plate 22. For securing the top 22 to the four sides 12 ... 18, a plurality of fasteners 24, shown in FIG. 1 as being four in number, are used. The fasteners 24 are preferably flat-headed screws. The fasteners 24 extend through appropriate apertures in the top 22 and extend downwardly into the sides and into appropriately aligned tapped apertures 26. The apertures 26 and the fasteners 24 are shown in FIGS. 1, 2, and 3.

For convenience, the elongated side plates 12 and 14 will sometimes be referred to herein as sides, and the other two side plates, or end plates 16 and 18, will be referred to as ends. The sides 12 and 14 are generally rectangular in configuration and they extend lengthwise with respect to the housing apparatus 10. The end plates 16 and 18, while the same height as the side plates 12 and 14, are not as wide as the side plates. As stated above, the four side plates 12 ... 18 are preferably integral with the bottom 20 and extend upwardly substantially perpendicularly thereto, and are appropriately secured to each other to define an integral rectangular box housing. For manufacturing purposes, it may be preferable to have the four sides and the bottom cast as an integral single element. Obviously, several casting methods may be used.

Extending transversely across the bottom 20, and extending between the sides 12 and 14, are a pair of slots 30 and 32. The slots 30 and 32 are preferably rectangular in configuration, as best shown in FIG. 3. The slots 30 and 32 are spaced apart from each other and from the end plates 16 and 18. The slots 30 and 32 are generally parallel to the end plates 16 and 18.

The slots 30 and 32 define areas of generally high impedance within the housing apparatus 10, while the relatively smooth bottom 20, except for the slots 30 and 32, define areas of relatively low impedance. For purposes of the present invention, it is highly desirable to have areas of low impedance and high impedance on the bottom 20 to minimize the propagation of rf fields beneath a circuit board 50. The circuit board 50 will be discussed below.

A chamber 36 is defined within the housing 10. Within the chamber 36, and thus within the housing apparatus 10, are disposed various circuit elements associated with the housing apparatus 10 and which cooperate to prevent rf interference. For securing the circuitry elements to the housing apparatus 10, or particularly to the bottom 20, there are a plurality of apertures 40, appropriately tapped, which extend downwardly into the bottom 20. As best shown in FIG. 2, four fastener elements 70 are used, and two such fastener elements are illustrated in FIG. 3, one of which is shown in phantom and the other is shown in full line.

Disposed on the bottom 20, or between the bottom 20 and the circuit board 50, is a dielectric layer 46. The circuit board 50 is disposed on the dielectric layer 46 and is appropriately secured to the bottom 20 of the housing apparatus 10. The circuit board 50 is preferably a three-layer element, including a dielectric substrate 52, which is well known and understood in the art. On the bottom of the substrate 52 is a solid conductive layer 54 which defines a ground plane. The ground plane layer 54 is typically a relatively thin layer of copper. On the top of the substrate 52 is a second conductive layer 56. The top conductive layer 56 may be referred to as the track side of the circuit board 50. That is, conductive tracks are etched into the thin copper conductive layer 56 and circuit elements are secured thereto. The circuit elements, including the conductive tracks, define the active electrical elements of the amplifier apparatus. The dielectric layer 46 serves to electrically insulate the bottom 20 from the ground plane layer 54. A typical example of the circuit elements involved with the board 50 is a GaAsFET low noise, high gain amplifier.

For securing the circuit board 50 to the bottom 20, a plurality of apertures, of which three, apertures 60, 64, and 66 are shown in FIGS. 3, 4, and 5, extend through the three layers of the circuit board and through aligned apertures 48 in the dielectric layer 46. The aperture 60, shown in FIGS. 4 and 5, aligns with the apertures 48 in the dielectric layer 46 and with the tapped apertures 40 which extend downwardly into the bottom 20. As best illustrated in FIGS. 3, 4, and 5, the apertures 48 and 60 are larger in diameter than are the tapped apertures 40. Fasteners 70, which are preferably screws, extend through the aligned apertures 48 and 60. The apertures 48 and 60 . . . 66 allow the fasteners 70 to extend into the tapped apertures 40 to secure the circuit board 50 to the bottom 20.

To prevent electrical contact between the fasteners 70 and the circuit board 50, insulators 72 may be disposed beneath the heads of the screw fasteners 70, as shown in FIG. 5. Since the diameter of the apertures 48 and 60 are relatively large compared to the diameter of the shank of the screw fasteners 70, electrical contact between the shank of the fasteners 70 and the circuit board elements 50 is prevented.

In FIG. 4 is shown a conductive washer 71 disposed beneath the head of the screw 70 and on top of the conductive layer 56. There may be occasions when it is desired to short a track on the circuit board 56 to the housing ground. In such cases, the dielectric washer 72 is omitted and the conductive washer 71 may be used.

If a short is desired between the track layer 56 and the housing 10, a conductive washer 71 may not be necessary, depending on the relative diameters of the head of a screw 70 and an aperture through a conductive track and the circuit board 50. However, it may be preferable to use a conductive washer regardless of the relative diameters to insure good electrical contact.

If the conductive top plate 22 is secured to the sides of the housing, thus enclosing the chamber 36, the chamber 36 becomes a cavity 36. This is illustrated in FIGS. 3, 4, and 5. Without the top 22, there is no cavity excitation and no mode suppressors are required.

A plurality of mode suppressors 74 may be used within the cavity 36. The mode suppressors 74 are conductive elements, such as brass or steel spring elements, which are disposed beneath the heads of the fasteners 70 and which extend upwardly against the bottom side of the top plate 22. Two mode suppressor 74 are illustrated, although more may be employed. The mode suppressors electrically connect the bottom plate 20 to the top plate 22 through the screw fasteners 70 within the cavity 36 and between the end plates 16 and 18 and the sides 12 and 14.

For purposes of clarity, four fasteners 70 are illustrated as being used to secure the circuit board 50 within the cavity 36 of the housing 12. Of the four fasteners 70, only two are shown as employing mode suppressors 74. However, it will be understood that more fasteners 70 and more mode suppressors 74 may be used, as desired, to attain the desired electronic results with respect to the apparatus of the present invention.

The apparatus 10 of the present invention is adapted to be connected to a coaxial cable input line and a coaxial cable output line. For such connection, a pair of connectors, including an input connector 80 and an output connector 90, are employed. These connectors are illustrated in FIGS. 1, 2, and 3. The input connector 80 includes an externally threaded portion 82 which comprises a grounded connection secured to the end panel or plate 16. The end plate 16 includes an aperture 17 extending therethrough, and the input connector 80 is secured to the end plate 16 about the aperture 17.

Extending coaxially through the connector 80 and through the aperture 17 is an insulated conductive terminal 84 which is in turn connected to an appropriate circuit track on the component side 56 of the circuit board 50.

The output connector 90 is substantially identical to the input connector 80. The output connector 90 is secured to the end plate 18 about an aperture 19 which extends through the end plate 18. The connector 90 also includes a threaded exterior portion 92 which is electrically connected to the plate 18.

An insulated terminal 94 extends coaxially through the output connector 90, through the aperture 19, and is appropriately connected to a conductive track on the component side 56 of the circuit board 50. The terminals 84 and 94 define the positive connections between the input signal, the amplifying electrical components of the circuit board 50, and the output signal from the apparatus 10. The exteriorly threaded portions 82 and 92 of the input and output connectors are appropriately electrically connected to the housing apparatus 10 through the walls 16 and 18, and define the ground portion of the input and output singals. The input and output signals are thus grounded to the housing. The housing accordingly comprises the signal ground.

The construction discussed in the preceding paragraphs and illustrated in FIGS. 2-5, comprises microstrip construction. However, it will be obvious that the apparatus of the present invention is also applicable to stripline construction. Thus, the particular configuration of the circuit board 50 is relatively immaterial as far as the housing apparatus 10 is concerned.

In FIGS. 3, 4, and 5, the dielectric layer 46 is illustrated as being relatively thick and as comprising a resinous or plastic material. However, it will be understood that any type of dielectric material may be used. For example, instead of a relatively thick layer of resinous or plastic material, any type of dielectric or nonconductive layer may be used, such as a relatively thin film layer of some type, a layer of paint, or even an anodized layer. The dielectric layer above the bottom 20 is used as a dc electrical block to prevent the flow of direct current between the housing 10 and the circuit board 50. The dielectric layer 46 allows the rf ground plane layer 54 of the circuit board 50 to be at a different dc electrical potential from the electrical potential of the housing itself.

To prevent resonating or resonance within the cavity 36, as previously discussed, the mode suppressors 74 are used. The mode suppressors 74 connect the top 22 and the bottom 20 to prevent resonating or propagation within the cavity by inductively shorting the top and the bottom of the cavity 36.

The slots 30 and 32, best shown in FIG. 3, define a radio frequency (rf) choke to isolate one end of the housing from the opposite end of the housing. The slots 30 and 32, as previously stated, comprise areas of high impedance, while the rest of the bottom 20, namely the smooth top or planar portion of the bottom 20, defines low impedance areas. The slots 30 and 32 interrupt the low impedance area and comprise high impedance areas to provide the rf choke capability. The employment of the rf choke thus varies the impedance under the circuit board 50 to disrupt electrical rf currents and fields which are present in the region between the ground plane 54 and the bottom 20 of the housing 10.

The bottom 20 comprises a carrier for the circuit board 50. The dielectric layer 46 beneath the circuit board 50 isolates the board 50 from the carrier and thus allows the rf ground, namely the ground plane 54, to be at a different electrical potential from the ground potential of the power supply, which power supply is not shown but is well known and understood in the art. At the same time, the slots 30 and 32, which comprise the rf choke for the apparatus, disrupts the rf currents beneath the board 50.

While only a pair of transversely extending slots 30 and 32 are illustrated in FIGS. 2 and 3, it is obvious that other deformations of the bottom 20, or of the circuit board carrier, may be included. Some other examples of such deformations are illustrated in FIGS. 7, 8, and 9, and will be discussed in detail in conjunction therewith.

As stated above, the bottom 20 of the embodiment of FIGS. 2-5 is shown as being relatively thick, with the slots 30 and 32 extending downwardly into the bottom 20. For this type of construction, die casting of an aluminum housing, without the top 22, comprises an attractive and advantageous method of manufacture. However, for other applications, other types of manufacturing may also be advantageous. One such example of another type of manufacture is illustrated in FIG. 7, which comprises a view in partial section of an alternate embodiment of the apparatus of the present invention. A housing 110 is illustrated in FIG. 6 without a top plate. It will be understood that a top plate, such as the top 22, may be used in conjunction with the apparatus 110 of FIG. 6. The housing 110 includes four walls, of which only three are shown in FIG. 6. They include a side wall 112 and a pair of end walls 114 and 116. The bottom of the housing 110 is closed by a bottom wall 118.

The housing 110 may be formed from a single sheet of relatively flat material by well known and understood fabricating techniques. In such case, the four walls and bottom will all be the same thickness. To increase the thickness of the bottom, on which a circuit board will be disposed, over an appropriate dielectric layer, not illustrated in FIG. 6, but in conformity with the discussion above in conjunction with the embodiment of FIGS. 1-5, a conductive layer 120 is disposed within the housing 110. The layer 120 is preferably made of the same metal that the housing 110 is made of in order to be electrically compatible therewith.

The layer 120 may be thicker than the thickness of the various layers or various walls and bottom for the housing 110 so as to include the appropriate slots or high impedance areas therein. Thus, the layer 120 includes a relatively flat or planar low impedance portion 122 interrupted by a pair of slots 124 and 126, which comprise high impedance areas. The net result of the housing 110 is substantially identical to the housing apparatus 10 except that the bottom for the housing 110 is in two pieces instead of a single piece as illustrated best in FIGS. 3 and 4.

For the rf chokes illustrated in the two embodiments discussed above, namely the embodiment of FIGS. 2-5 and the embodiment of FIG. 6, only a single pair of transverse slots has been illustrated and discussed as comprising high impedance areas in each embodiment. The high impedance areas are contrasted with low impedance areas on the bottom of the cavities and beneath the circuit boards disposed within the respective housings. It is obvious that there are other types of geometric configurations possible for the high impedance areas. Such alternate geometric configurations of high impedance areas, contrasted with low impedance areas, on the bottoms of housings are illustrated in FIGS. 7, 8, and 9. FIGS. 7, 8, and 9 comprise top views of the lower portions of housings which illustrate various alternate geometric configurations of high and low impedance areas.

In FIGS. 7, 8, and 9, only the lower portions of the respective housings are illustrated, including four walls, which comprise two side walls and two end walls, and bottom closure portions. The other elements necessary for the apparatus of the present invention, including a top cover plate, a circuit board, and a dielectric layer between the circuit board and the bottom of the housings are not illustrated and accordingly will not be discussed.

FIG. 7 is a top view of a housing 210 which includes a pair of side walls 212 and 214 and a pair of end walls 216 and 218. The four walls 212 . . . 218 are generally rectangularly configured and each is disposed substantially perpendicularly to adjacent walls and thus the side walls are parallel to each other and the end walls are parallel to each other.

The housing 210 also includes a bottom 220 which is substantially perpendicular, and appropriately secured, to the four walls, all as has been discussed in conjunction with the embodiment of FIGS. 1–5. The bottom 220 is divided into generally two portions or areas, including flat or planar low impedance area 222 and high impedance areas. The flat low impedance areas 222 are disrupted by four recessed areas defining areas of high impedance. The four high impedance areas include a transverse slot 224 which extends between the side walls 212 and 214 and is generally parallel to and spaced apart from the end wall 218.

A second high impedance area is a relatively large rectangular recessed area 226. The recessed area 226 is disposed between the walls 212 and 214 and is spaced apart from the transverse recessed slot 224.

Spaced apart from the relatively large rectangular recess 226 is a relatively small rectangular or square recessed area 228. The recessed area 228 is also a high impedance area.

The fourth high impedance area is a slot 230 which extends outwardly from the wall 214 generally parallel to the end wall 216. The slot 230 does not extend fully between the walls 212 and 214, but merely outwardly from one of the walls, namely the wall 214. The slot 230 is disposed between the end wall 216 and the relatively small rectangular or square recessed high impedance area 228. The slot 230 terminates in the bottom just short of the wall 212.

It will be understood that the particular orientation or arrangement of the high impedance areas is relatively unimportant in general terms. The particular design of a high impedance area, or its particular orientation will depend on other factors, such as the circuitry involved on the circuit board which is disposed above the bottom of the housing, and accordingly above the high and low impedance areas thereon.

FIG. 8 comprises a top view of a housing 310 which includes three high impedance areas which are of geometric configurations different from those discussed above in conjunction with FIGS. 1–7. The housing 310 of FIG. 8 includes a pair of side walls 312 and 314 and a pair of end walls 316 and 318. The four walls and the bottom 320 define a generally rectangular housing, but without a top plate, such as has been discussed above in conjunction with FIGS. 1–7.

A recess 324 is shown extending into the bottom 320 from the end wall 316. The recess 324 comprises a generally U-shaped slot, with the arms of the "U" extending outwardly from the wall 316 and the transverse leg extending between the arms substantially parallel to the end wall 316. The recess 324 defines a high impedance area having a generally U-shape.

Extending inwardly from the opposite end wall 318 from the end wall 316 and its high impedance area 324 is a second high impedance area 326. The high impedance area 326 is a recess having a general half-moon circular configuration. The slot 326 is a semi-circular or half-moon slot using the wall 318 as a base. While the high impedance area 324 is generally U-shaped, the high impedance area 326 is a 180° curved slot.

Both the high impedance areas 324 and 326 may be located symmetrically with respect to the side walls 312 and 314 and accordingly may be disposed generally below and in alignment with the input and output connectors, which are not shown in FIG. 8. Input and output connectors are also not shown in FIGS. 6, 7, or 9, but are shown in FIGS. 1–3.

A third geometrical configuration is used for a recessed high impedance area 328 on the bottom 320. The high impedance area 328 is generally in a trapezoidal configuration, and thus is not symmetrical with respect to the end walls 316 and 318. As shown in FIG. 8, the trapezoid which defines the high impedance area 328 includes a pair of parallel bases, the long base of which is disposed adjacent to the wall 312 and the short base of which is disposed adjacent to the wall 314. The slanted sides of the trapezoid extend between the two parallel bases.

FIG. 9 illustrates another type of rf choke which is generally symmetrical with respect to a housing 410. The housing 410 includes a pair of sides 412 and 414, a pair of ends 416 and 418, all four of which are secured to and extend upwardly from a bottom 420. The housing 410 is, of course, generally rectangular in configuration.

The bottom 420 includes two portions, a generally flat low impedance area 422 which extends inwardly from the four sides, and a recessed high impedance area 424. The recessed high impedance area 424 is in a rectangular configuration and is disposed centrally and symmetrically with respect to the four walls 412 . . . 418 and the bottom 420.

As will be understood from the above discussion, including the discussion of FIGS. 7, 8, and 9, various types of geometrical configurations may be used for rf chokes with respect to the apparatus of the present invention. The bottoms of the various housings include both high impedance and low impedance areas which define the rf chokes. The particular geometric configuration used may vary from housing to housing, depending on the circuitry involved. There may be a single high impedance, such as in FIG. 9, or there may be two, three, or four high impedance areas, or more, depending on the particular application. Moreover, the high impedance areas may include relatively simple slots, they may include generally rectangular or square recesses or they may involve or include other types of geometric configurations. Thus, the high impedance designs are not limited to the designs illustrated.

As has been discussed, the purpose of the high impedance and low impedance areas defining the rf chokes and the bottom of the various housings serve to isolate one end of the circuit board from the other, or to disrupt the rf currents under the circuit board. Since the circuit board is disposed against the flat, low impedance area of the bottom of the housing, the slots or recessed areas comprise high impedance areas which disrupt rf currents under the circuit boards. The propagation of the rf fields underneath the circuit board from the input to the output are ideally reduced to a level where they do not interfere with the gain performance of the amplifier. The high impedance regions are accordingly generally configured or created by designing the high impedance and low impedance sections according to quarter wave length areas.

There is preferably a low impedance area of about onequarter wave length followed by a high impedance area also of about a quarter wave length. The quarter wave length high impedance area is then followed by another low impedance area. By using alternate quarter wave length impedance transformations, maximum isolation may be achieved. However, substantial improvements in isolation may also be achieved with other than quarter wave length transformations. Thus, various geometric configurations may be applicable to the design of an rf choke, depending on the particular frequencies involved in the design of the amplifier.

As will be understood, the present invention is not restricted to low noise amplifiers. However, a primary application of the present invention is for GaAsFET amplifiers which require two voltages.

The apparatus of the present invention electrically separates the rf ground plane of a dielectric board from a housing in which the board is disposed and prevents the propagation of rf fields and currents in the region between the rf ground plane and the housing. This occurs even though the "housing" may comprise only a bottom plate, without side walls and end walls. This concept may be understood by reference to FIG. 3.

In the side view of FIG. 3, if the four plates comprising the side walls and end walls were eliminated, the connectors 80 and 90 may be secured directly to the bottom plate 20. Such securing may be accomplished by using a screw fastener directly into the end of the bottom 20 through a flange, not shown, or the like on the connectors 80 and 90. The pins 84 and 94 would still make contact with the component side 56 of the circuit board 50, as shown in FIG. 3. That is, the connectors 80 and 90 would still be in the position shown, withthe pins 84 and 94 electrically connected to appropriate circuit tracks on the side 56 of the circuit board 50.

Thus, for certain applications a "housing" for the electronic components may comprise only a bottom plate. For other applications the "housing" may include a bottom plate and four walls, and for other applications, the "housing" may include a bottom plate, four walls, and a top plate. Regardless of whether the walls and a top plate is used, low impedance and high impedance areas will be present on the bottom plate and a dielectric layer will be disposed between the bottom plate and the circuit board. In addition, mode suppressors may be used when a top plate is used with the walls to prevent resonance within the cavity.

While the primary use of the apparatus of the present invention may be for amplifiers, as previously mentioned, there may be other applications, also. Applications may include filters and electronic circuits operating at gigahertz frequencies.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted for specific environments and operative requirements without departing from those principles. The appended claims are intended to cover and embrace any and all such modifications, within the limits only of the true spirit and scope of the invention. This specification and the appended claims have been prepared in accordance with the applicable patent laws and the rules promulgated under the authority thereof.

What is claimed is:

1. Housing apparatus for electronic components, including, in combination:
    housing means, including bottom means, for receiving electronic components;
    dielectric means comprising a dc electrical block disposed on the bottom means;
    circuit board means for electronic components disposed on the dielectric means, including
        a substrate,
        a ground plane on the substrate, and
        a track side on the substrate remote from the ground plane for receiving electronic components; and
    low impedance areas and high impedance areas on the bottom means defining rf choke means beneath the ground plane.

2. The apparatus of claim 1 in which the low impedance areas comprise planar portions of the bottom means.

3. The apparatus of claim 2 in which the high impedance areas comprise slot means extending downwardly from the planar portions of the bottom means.

4. The apparatus of claim 3 in which the slot means includes a plurality of slots spaced apart from each other on the bottom means.

5. The apparatus of claim 4 in which the housing means further includes side means secured to and extending upwardly from the bottom means and defining with the bottom means a chamber in which the electronic components are disposed.

6. The apparatus of claim 5 in which the side means includes a pair of side walls spaced apart from each other and a pair of end walls spaced apart from each other, and the plurality of slots are spaced apart from each other and from the end walls.

7. The apparatus of claim 6 in which the plurality of slots are spaced apart from each other in quarter wave length distances.

8. The apparatus of claim 7 in which the housing means further includes a top plate secured to the side means for covering the chamber and thereby defining a cavity.

9. The apparatus of claim 8 in which the housing means further includes mode suppressor means disposed within the cavity and electrically connecting the bottom means and the top plate.

10. The apparatus of claim 9 in which the mode suppressor means comprises a plurality of conductive strips spaced apart from each other within the cavity.

11. The apparatus of claim 1 in which the housing means is made of conductive material.

* * * * *